United States Patent
Allen, III et al.

(10) Patent No.: US 7,023,230 B1
(45) Date of Patent: Apr. 4, 2006

(54) METHOD FOR TESTING IDD AT MULTIPLE VOLTAGES

(75) Inventors: Ernest Allen, III, Hillsboro, OR (US); David Castaneda, Clackamas, OR (US)

(73) Assignee: LSI Logic Corporation, Milpitas, CA (US)

(*) Notice: Subject to any disclaimer, the term of this patent is extended or adjusted under 35 U.S.C. 154(b) by 77 days.

(21) Appl. No.: 10/700,791

(22) Filed: Nov. 3, 2003

(51) Int. Cl.
*G01R 31/02* (2006.01)

(52) U.S. Cl. ...................... 324/763; 324/73.1
(58) Field of Classification Search ............ 324/73.1, 324/158.1, 754, 763, 765; 438/11, 14, 17–18; 714/724, 733, 734–736; 257/40, 48
See application file for complete search history.

(56) References Cited

U.S. PATENT DOCUMENTS

| | | | | |
|---|---|---|---|---|
| 5,321,354 A | * | 6/1994 | Ooshima et al. | 324/765 |
| 5,742,177 A | * | 4/1998 | Kalb, Jr. | 324/765 |
| 5,889,408 A | * | 3/1999 | Miller | 324/765 |
| 5,889,409 A | * | 3/1999 | Kalb, Jr. | 324/765 |
| 6,239,605 B1 | * | 5/2001 | Miller | 324/765 |
| 6,239,606 B1 | * | 5/2001 | Miller | 324/765 |
| 6,239,609 B1 | * | 5/2001 | Sugasawara et al. | 324/769 |
| 6,242,934 B1 | * | 6/2001 | Kalb, Jr. | 324/765 |
| 6,590,405 B1 | * | 7/2003 | Okayasu | 324/760 |
| 6,623,992 B1 | * | 9/2003 | Haehn et al. | 438/11 |

* cited by examiner

*Primary Examiner*—Jermele Hollington
(74) *Attorney, Agent, or Firm*—Beyer Weaver & Thomas, LLP

(57) ABSTRACT

According to one embodiment, a method of testing an integrated circuit is provided. The quiescent current measuring of an integrated circuit is measured at two voltages. The functional relationship between the current measurements is determined and compared against a predetermined functional relationship to determine whether a defect exists in the integrated circuit.

20 Claims, 4 Drawing Sheets

METHOD FOR TESTING IDD AT MULTIPLE VOLTAGES

BACKGROUND OF THE INVENTION

1. Field of the Invention

The present invention relates to processes involved in the manufacturing and testing of semiconductor devices. More particularly, the present invention relates to methods for testing semiconductor electronic devices.

2. Description of the Related Art

As integrated circuit devices grow smaller and smaller, the testing of the integrated circuits presents greater challenges. For example, the shrinkage of transistor sizes to the point that critical dimensions are well below one micron ($10^{-6}$ m) has compelled designers to reduce operating voltages to maintain device reliability. And while designers enjoy a significant improvement in device speeds due to the smaller geometries employed, it has not been possible to reduce power consumption in direct relation to those critical dimensions. As a result, device currents have tended to increase, which has forced designers to employ ever-greater amounts of ingenuity to the problem of distributing the total current available to the designed devices.

Semiconductor wafer fabrication involves a series of processes used to create semiconductor devices and integrated circuits (IC's) in and on a semiconductor wafer surface. Fabrication typically involves the basic operations of layering and patterning, together with others such as doping, and heat treatments. Typically, a large number of dies are formed on a wafer using these methods. Many of these dies may have defects occurring during the fabrication process, for example during the patterning of layers, which affect the reliability of the die. Some defects, for example, directly affect the functionality of the circuit resulting in functional failure. Other defects may adversely affect the reliability of the circuit resulting in an early lifetime failure or failure under varying operating conditions.

Some conventional testing methods for identifying defects measure current in a device. When a device draws a large amount of current, this condition can have a variety of causes: some benign, and some far less so. That is, normal process variations may produce natural variations in device electrical characteristics that make differentiation of good die from defective die difficult. For example, current measured in a CMOS transistor may vary in accordance with the channel length. The target channel length is specified by design to meet performance characteristics such as current consumption and device speed. However, normal process variations resulting in a larger channel length (L-effective) will result in a device having low speed and low current, though for all other purposes the device is normal. Conversely, as explained further below, process variations may result in an effective channel length smaller than the target length, thus resulting in a high speed, high current device.

One conventional test measures the static current, i.e., quiescent current (Iddq) to differentiate between good and defective die. Identification of defects is based on the fact that a CMOS circuit does not draw any significant current when in a stable situation. Thus, in a quiescent state, only the leakage current flows, which is often negligible, in some cases on the order of several nanoAmps. A defect such as a short between transistors may cause the quiescent current to increase, indicating a manufacturing defect. Such defects may cause either functional failures or early lifetime failures.

FIGS. 1A–1B are diagrams depicting such fabrication details which may affect the ability of quiescent current testing to identify defects. As illustrated in FIG. 1A, the effective length 102 (L effective) of the channel of the MOSFET device 100 may vary in accordance with process variations in the wafer. The channel forms between the source and drain regions 103. Since speeds of semiconductor devices such as MOSFET transistors are linked to the channel length, differences in effective length affects both the speed behavior of the device and the quiescent current. For example, an effective length 102 of the channel, larger than the target length 104, will result in a lower speed for the device with a lower observed quiescent current. In contrast, as illustrated in FIG. 1B, an effective length 108 that is smaller than the target length 104 will result in a speeded up version of the device 100. That is, the channel formed between the source drain regions 103, results in the high-speed high current device.

$I_{ddq}$ testing is a sensitive technique, able to detect defects in an early stage and offers an alternative to expensive or time-consuming approaches such as burn-in testing. But the downsizing of semiconductor devices to the sub-micron level has made it increasingly difficult to identify and separate outliers from the intrinsic die distribution using conventional quiescent current testing and evaluation. That is, normal process variations will produce an intrinsic probability distribution for a measured parameter, such as the quiescent current. A data point is an "outlier" if it comes from a different probability distribution or from a different deterministic model than the remainder of the data. It is important to effectively screen the dies to identify and separate outliers from the intrinsic distribution, a task made more difficult by the downsizing of the devices.

Many variations of fabrication defects can contribute to the current variations including but not limited to possible lateral shorts between signal lines, vertical shorts (spiking) between layers, or both. Even opens (gaps) on some signal lines, or gaps between vertically stacked layers that are designed to be electrically connected to each other, can lead to higher, rather than lower, current readings.

Excessively low current readings can also be an indication of manufacturing defects, so that in general it is necessary to test the measurement against two limits—one lower limit and one higher limit—before determining that the device under test is defective.

Hence, reliably detecting defective devices is problematic when using conventional methods which measure device current. That is, a device without manufacturing defects may provide an identical current measure as a defective device. For example, a specific defect in a device may draw a large amount of current and be compensated somewhat by the rest of the circuit working correctly, though having a lower intrinsic current.

One conventional method for resolving this issue compares the device under test to some known good 'reference device' that was manufactured at the same time and went through the same tools, i.e., a 'nearest neighbor correlation'. Unfortunately, this method requires post-processing, since only the last device tested on a wafer can be compared inline with the current readings of all of its neighbors.

Accordingly, it is desirable to provide a more effective electrical screening and evaluation method for detecting defects in die.

SUMMARY OF THE INVENTION

To achieve the foregoing, the present invention provides methods for detecting fabrication defects in devices. A series of current readings are taken at different voltages applied to the device. When the semiconductor device is prototyped and characterized, relatively simple functional relationships among the various readings at the various voltages may be extracted.

According to one embodiment, a method of testing semiconductor devices is provided. A first and second current for a device is determined respectively at a first and second voltage. A functional relationship is determined for the first and second measured currents. The functional relationship is compared to an expected functional relationship to determine whether the device is defective. According to an alternative embodiment, the functional relationship is a ratio between the quiescent currents at the applied voltages for the device. According to another alternative embodiment, the expected functional relationship is a running average for the tested devices.

These and other features and advantages of the present invention are described below with reference to the drawings.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In a preferred embodiment of the invention, a series of current readings are taken at different voltages. When the semiconductor device is prototyped and characterized, relatively simple functional relationships among the various readings at the various voltages may be extracted. For example, according to one embodiment, the functional relationship extracted is the ratio of currents. While for illustrative purposes testing will be described in the context of quiescent current testing, the present invention is not so limited. However, quiescent current testing offers high speed testing and in part for that reason has gained prominence in the testing industry. Quiescent current or $I_{ddq}$ is the current required to power the CMOS integrated circuit after all logic transitions are made. In present CMOS integrated circuits, the magnitude of $I_{ddq}$ is commonly less than 1 nA. However, when there is a defect such as a gate-to-source short, the quiescent current is one or more orders of magnitude higher.

While not wishing to be bound by any theory, it is believed that current readings that are heavily influenced by defects will behave differently over a change in applied voltages than will the current readings of properly manufactured (i.e., defect-free) devices. In general, the prevailing practice in manufacturing has been to reduce the number and duration of $I_{dd}$ measurements, in order to reduce the overall time of the tests done on the device in manufacturing. By increasing the time for testing modestly, the present invention achieves dramatic improvements in the ability to differentiate defective die from good die.

Figures 1A, 1B:
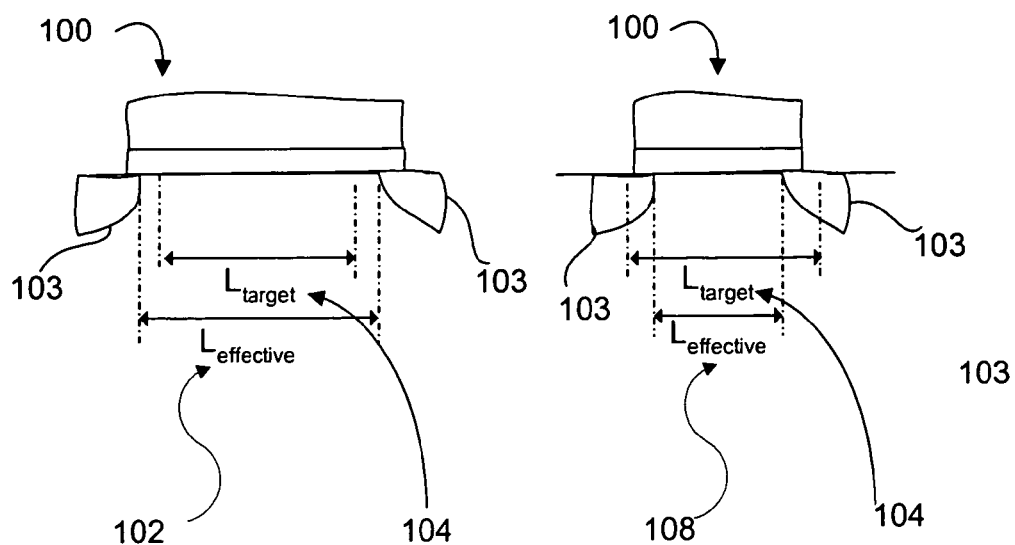
FIG. 1A is a diagram illustrating a low current conventional device.
FIG. 1B is a diagram illustrating a high current conventional device.
Figure 2:
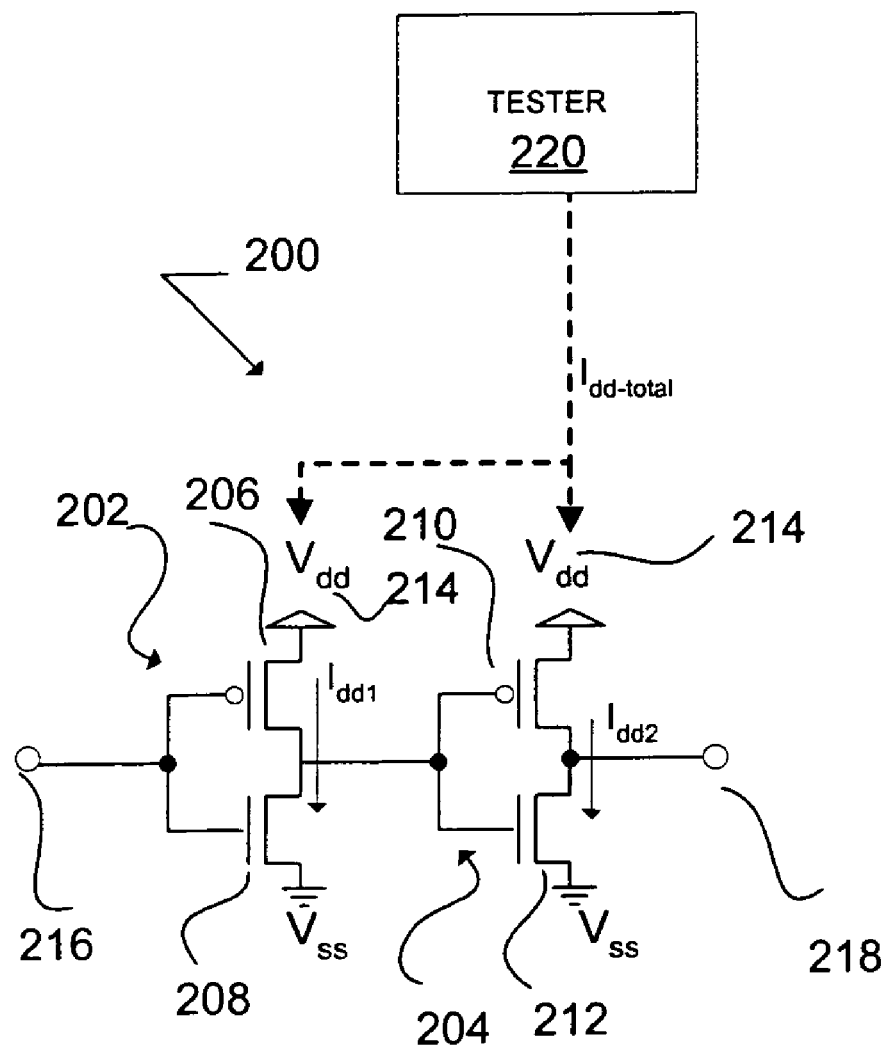
FIG. 2 is a diagram of a device and tester configured to identify defects in accordance with one embodiment of the present invention.

FIG. 2 is a diagram of a device and tester configured to identify defects in accordance with one embodiment of the present invention. In a preferred embodiment of the invention, a series of current readings are taken at different voltages. In a preferred embodiment, the supply current ($I_{dd}$) in a device is measured. As discussed herein, a semiconductor device may comprise any level of integration. That is, the device under test may be as simple as a transistor, a gate, or may encompass an entire integrated circuit.

As illustrated, the semiconductor device 200 includes CMOS inverters 202 and 204. Each of the inverters 202, 204 includes PMOS and NMOS transistors. For example, CMOS inverter 202 includes PMOS transistor 206 and NMOS transistor 208, whereas CMOS inverter 204 includes PMOS transistor 210 and NMOS transistor 212. This circuit 200 design is intended to be illustrative and not limiting. That is, the circuit is intended to illustrate a general configuration between a device under test and a tester to generate multiple current measurements for each device. The testing methods described herein are intended to apply to any type of semiconductor device without limitation. That is, the plurality of voltages may be applied to a transistor, a passive device, a portion of a circuit, or an entire chip. Further, the transistors may comprise any form including but not limited to CMOS, NMOS, PMOS, and bipolar.

In accordance with this embodiment, the tester 220 is configured to apply a plurality of supply voltages 214 ($V_{dd}$) and input(s) 216 during device testing. The tester preferably is an Automated Test Equipment (ATE) test platform. ATE testers are available commercially and their functions known to those of skill in the art. Preferably, the tester 220 is configured to perform Idd and Iddq testing and to apply test vectors to the device under test. For example, a suitable logic value is transmitted by the tester 220 to the input 216 of the device 200 during the current testing.

As smaller geometric features predominate on new generations of devices, supply voltages have decreased. For example, in current devices, a nominal supply voltage of 1.5 volts may be typical for 0.13 μm technology, whereas the core power supply is typically 1.8 v for 0.18 μm technology. Preferably, the tester 220 is configured to apply different voltages to the supply voltage pad(s) connected to the device supply voltage ($V_{dd}$) lines 214. These applied voltages need not be at the exact limits of device operation. For example, according to a preferred embodiment, the applied voltages are within the range of 50 to 140% of the nominal $V_{dd}$.

According to another embodiment, the low and high applied voltages are respectively 60% and 120% of nominal $V_{dd}$. According to yet another embodiment, the applied voltages fall within typical production limits of Vdd+/−5% or 10%. Without intending to limit the scope of the invention, it is expected that larger variations between a high and low supply voltage applied by the tester 220 would result in an increase in the accuracy of discriminating between good and defective die. Accordingly, the scope of the invention is intended to extend to any range of voltages which may be safely applied to the device, that is, without causing damage to the device.

ATE testers are commonly configured to include current measurement functions for $I_{dd}$ and $I_{ddq}$ testing. As illustrated in FIG. 2, the drain current ($I_{dd\text{-}total}$), which represents the combination of the drain current in CMOS transistor 202 ($I_{dd1}$) and the drain current in CMOS transistor 204 ($I_{dd2}$), can be evaluated in the tester 220. Alternatively, current sensing devices known to those of skill in the art may be incorporated into the chip to provide a more localized measure of current. According to a preferred embodiment, the current measurement for each applied voltage is a quiescent current measurement for a plurality of transistors in the device or circuit.

The present invention takes advantage of the fact that the functional relationship of these current measurements to each other—when the measurements are taken on correctly manufactured device—turns out to be much more well-behaved than the functional relationship of either current measurement to the voltage at which it is measured. Defective devices, on the other hand, will often show significant departures from this relationship. That is, the functional relationship between the current measurements at the different voltages provides a reliable indication of the integrity of the manufacturing process for the device.

Figure 3:
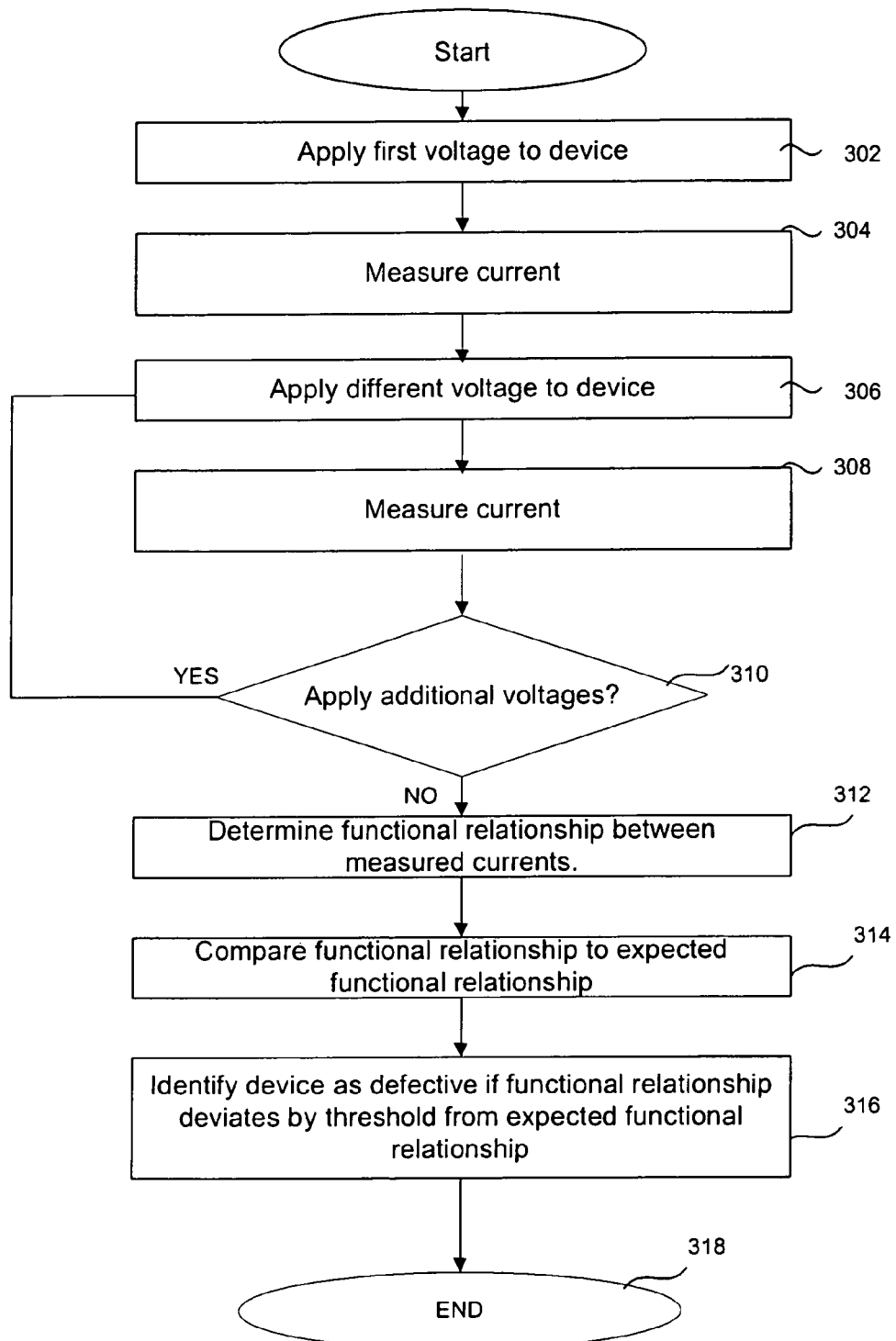
FIG. 3 is a flowchart illustrating a method of identifying defective devices in accordance with one embodiment of the present invention.

FIG. 3 is a flowchart illustrating a method of identifying defective devices in accordance with one embodiment of the present invention. After the process begins, a a first voltage is applied to the device at an operation 302. Preferably the voltage is applied to the device's I/O pins in a test pattern generated by an ATE. The initial test pattern will preferably incorporate suitable logic values for placing the device in a desired state. That is, the tester is preferably configured to generate a series of test patterns in sequence, each of the test patterns configured to apply a desired voltage to the device under test and suitable inputs to the device to ensure that adequate testing of the various portions of the device is effectuated. Methods of identifying and generating suitable test vectors are known to those of skill in the art and therefore further description is deemed unnecessary here.

Next, as illustrated in operation 304, the current for the device is measured. This may be, for example, a drain current $I_{dd}$ for a specific portion of the device, a current for a larger circuit comprising a large number of transistors, or the drain current for the entire chip. According to one preferred embodiment, the current is a quiescent current. Quiescent current testing typically involves applying test voltages to the gates of the CMOS devices. Normally, a very small amount of current flows across the gate oxide when the test voltage is applied across the gate oxide interface, but when shorting defects occur in the dielectric, for example, large currents may flow, i.e., abnormally large quiescent current. The current may be measured on the tester or alternatively by using current sensing devices integrated on the chip as known to those of skill in the art. Without intending to be limiting, the measured currents in one embodiment may be selected currents other than quiescent currents, for example, including power supply currents for specific cores, both digital and analog. For example, the current measure may comprise in one embodiment PLL Static $I_{DD}$.

Next, at an operation 306, a second (different) voltage is applied, preferably using the same equipment and procedures as described with respect to operation 302. Next, in operation 308, the current is measured for this second voltage. A determination is then made in step 310 as to whether to apply additional voltages. That is, if no further voltages need to be applied to the device, the process proceeds to step 312 where the functional relationship between the measured currents is determined.

Relatively simple functional relationships among the various current readings at the various voltages may be extracted and used to determine fabrication defects. For example, according to one preferred embodiment, the functional relationship extracted is the ratio of currents. This relationship is intended to be illustrative and not limiting. The scope of the invention is intended to extend to all functional relationships between the measured currents determined by the techniques of the present invention. For example, the functional relationship between the 2 currents may be weighted by constants so that, for example, the measured current at the second voltage may have a greater impact of defined functional relationship than the current at the first voltage. For another nonlimiting example, the functional relationship may include the ratios of the currents raised to a predetermined power, i.e., $\text{current}_1{}^n/\text{current}_2{}^m$. By measuring currents at 2 or more voltages, the unique behavior of the defective devices may be more readily determined.

If, in operation 310 it is determined that further voltages are required in the testing protocol, i.e., further iterations of varying the supply voltages and measuring the current, the procedure advances to operation 306 where a new supply voltage is applied and a corresponding current measurement (operation 308) is made. By recording current measurements at a third voltage, additional expected functional relationships among the three measurements may be extracted. Each additional measurement adds higher orders of corrections to the basic functional relationship, until a point where is reached where only by the measurement error of the individual measurements limits the accuracy of the method.

After completion of operation 312, a comparison of the functional relationship to a reference is performed in operation 314. The reference value may be the expected functional relationship determined for a chip prototype or from a history of similar chips already fabricated. When the semiconductor device is prototyped and characterized, relatively simple functional relationships among the various current measurements at the various voltages may be readily extracted.

In an operation 316, the device is determined to be defective if the functional relationship deviates from the expected functional relationship by a predetermined threshold. For example, if the functional relationship is taken to be a simple ratio of currents, e.g. 1.10, then the defective devices may be defined as those having ratios deviated from the expected ratio by, for example, more than 0.05. The latitude permitted before determining a device is defective is process dependant, i.e., dependant upon the voltages used, the types of currents measured, and the types of devices tested among other factors. Preferably, where the functional relationship is the current ratio, a deviation of more than 20% from the expected ratio results in the determination that the device is defective. Depending on the maturity of the technology as well as any design related sensitivities, the deviation may accordingly be adjusted.

Preferably the tester is capable of recording the measured current values and determining the functional relationship between the values. Testers are commonly equipped with processor to generate test patterns and to analyze the results. Alternatively, the measured results may be transmitted to an external microprocessor, such as included in a general purpose computer or other programmable device or dedicated integrated circuit to determine and evaluate the functional relationships as described above After identifying the devices as defective or not, the process ends at an operation 318.

According to an alternative embodiment, a running average of the ratio of the two (or more) $I_{dd}$ readings is extracted, and all subsequent devices after the first are compared to the running average ratio. This embodiment removes the need for extensive characterization of the functional relationship before the test procedure is implemented in the manufacturing flow, and facilitates tracking of process variations.

Figure 4:
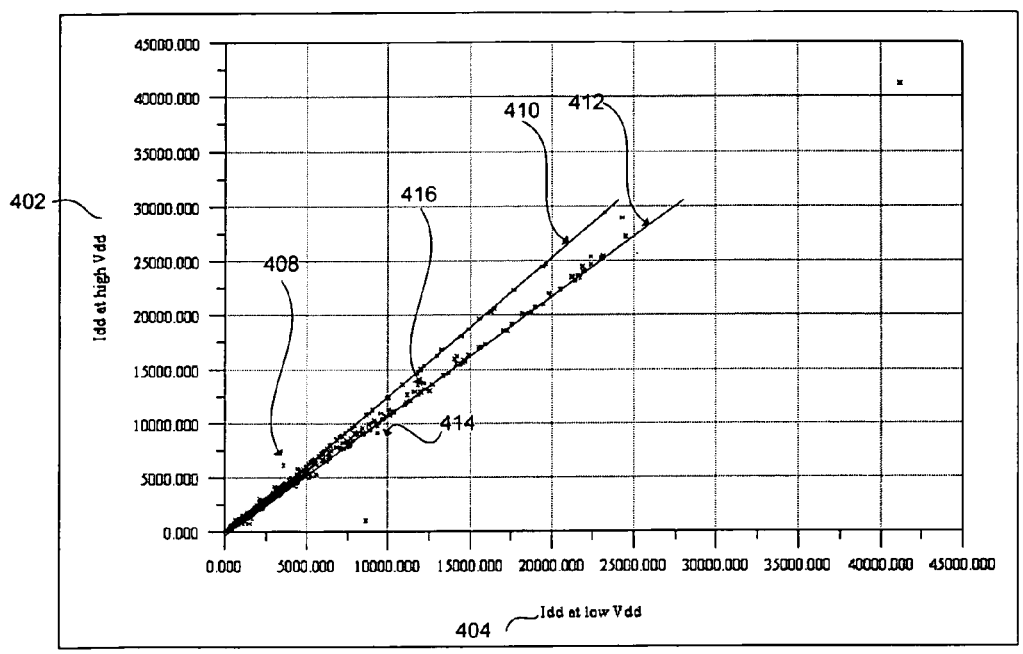
FIG. 4 is a graphical plot of high and low voltage currents for various die in accordance with one embodiment of the present invention.

FIG. 4 is a graphical plot of current ratios for various die, i.e., lot data for several lots for a generic product. These plots are representative of the functional relationship used in accordance with one embodiment of a method of the present invention. As illustrated, measured currents for a collection of dies at high supply voltages ($V_{dd}$) 402 are represented along the y axis and plotted against the measured currents for the dies for the low supply voltage 404. The data generally may be characterized in the form of a collection of straight lines which emanate from the origin.

Each straight line is representative of data from a single lot, the slope of the line being indicative of the ratio of currents. Even with the variations in lots, outliers may easily be identified by this technique. That is, defective devices, such as represented by die 408, may be identified and eliminated due to their deviance from the expected line (410). Preferably, the observed slope and intercept is encoded into the test program, and once the first reading is taken, an 'expected' result for the second current reading is determined. If the actual result falls too far outside the expected line or band, then the device is rejected as being likely defective. With this method, an expected result may be tailored for the device under inspection by historical data from wafers previously fabricated or even from devices fabricated on the same die but measured earlier and hence the accuracy in detecting defects increased.

According to an alternative embodiment, a "theoretical" line 412 may be drawn through the origin of the graph illustrated in FIG. 4, the line having a slope of (current at high $V_{dd}$/current at low $V_{dd}$), which represents the relationship to be expected if the device's current consumption was strictly ohmic in nature. This is represented in FIG. 4 by line 412, such line having a slope of approximately 1.1.

For some designs the actual distribution of measured currents may deviate significantly from this "theoretical" line 412, and for others designs the distribution may correspond closely to the line. It is, however, highly unlikely that a properly manufactured device will generate a point located on the opposite side of the theoretical line 412 from the preponderance of other units from the same wafer. For example, unit 414 is located on the opposite side of the line 412 from units 416 formed on the same wafer. In such cases it is far more likely that one of the two measurements is in error. In this situation, a signal may be generated to retest the device in order to accurately determine the functional relationship and hence the position of the device in the distribution.

The techniques of the present invention provide the capability of discriminating between good and defective die without the need for dramatic changes in test equipment. By using this technique, many of the advantages of $I_{dd}$ and $I_{ddq}$ testing can be extended to circuits that otherwise would be poor targets for $I_{ddq}$ testing. For example, identification of faults is not limited to those situations where fault detection require large quiescent currents.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for testing a semiconductor device, the method comprising:
    measuring for a first semiconductor device a first current at a first voltage and a second current at a second voltage;
    identifying a functional relationship between the first and second currents wherein the first and second voltages are set within a range of about 50 to 140% of a nominal supply voltage for the device; and
    comparing the functional relationship to a predetermined relationship to determine whether the device is defective, wherein the predetermined relationship is determined by at least one of evaluating the functional relationship for at least one other die on the same wafer or is determined from a plurality of dies fabricated previously.

2. The method as recited in claim 1 wherein the fictional relationship is a ratio between the first and second currents.

3. The method as recited in claim 1 wherein the first semiconductor device is a transistor.

4. The method as recited in claim 1 wherein the first semiconductor device is an integrated circuit.

5. The method as recited in claim 1 further comprising measuring a third current at a third voltage and wherein identifying the functional relationship comprises identifying the functional relationships between the first, second, and third currents.

6. The method as recited in claim 1 wherein the first and second currents are quiescent currents.

7. The method as recited in claim 1 wherein the device is determined to be defective if it deviates from the predetermined relationship by a predetermined threshold.

8. The method as recited in claim 7 wherein the functional relationship is a ratio of the first and second currents and the predetermined threshold is about 20% of the value determined for the ratio.

9. The method as recited in claim 1 wherein the first and second voltages are set within the range from 60 to 120% of a nominal supply voltage for the device.

10. The method as recited in claim 1 wherein the first and second voltages are supplied by automated test equipment.

11. The method as recited in claim 1 wherein the first and second currents are measured by automated test equipment.

12. The method as recited in claim 1 wherein the predetermined relationship comprises a running average of the functional relationship for the devices previously tested.

13. The method of claim 1 wherein the predetermined reference further comprises an expected functional relationship between said first and second currents as determined by at least one of: a measurement of a prototype chip or characterization of a history of similar chips already fabricated.

14. The method of claim 1 wherein the predetermined reference is further related to an ohmic linear relationship defined by the ratio of a first current at high $V_{dd}$ and a second current at low $V_{dd}$.

15. The method of claim 1 wherein the functional relationship further comprises an exponential relationship between the first and second currents.

16. A method for testing a semiconductor die, the method comprising:
   measuring for the semiconductor die at least two quiescent currents, the first current of the two quiescent currents measured when a first supply voltage is applied to a supply terminal of the die and the second current measured when a second supply voltage is applied to the supply terminal of the die wherein the first and second voltages are set within the range from 50 to 140% of a nominal supply voltage for the device;
   determining a measured ratio between the first and second currents;
   comparing the measured ratio with an expected ratio for quiescent currents; and
   determining if the die is defective when the measured ratio differs from the expected ratio by a predetermined threshold.

17. The method as recited in claim 16 wherein the first and second voltages are supplied by automated test equipment.

18. The method as recited in claim 16 further comprising measuring a third quiescent current at a third voltage and determining a measured ratio between the first and third currents, and the second and third currents;
   comparing the measured ratios for the first and third currents and second and third currents with corresponding expected ratios for quiescent currents; and
   determining if the die is defective when any of the measured ratios differs from the corresponding expected ratios by a predetermined threshold.

19. A method for testing a semiconductor device, the method comprising:
   measuring for a first semiconductor device a first current at a first voltage and a second current at a second voltage;
   identifying a functional relationship between the first and second currents wherein the functional relationship is a ratio of the first and second currents and the predetermined threshold is about 20% of the value determined for the ratio; and
   comparing the functional relationship to a predetermined relationship to determine whether the device is defective, wherein the predetermined relationship is determined by at least one of evaluating the functional relationship for at least one other die on the same wafer or is determined from a plurality of dies fabricated previously.

20. A method for testing a semiconductor device, the method comprising:
   measuring for a first semiconductor device a first current at a first voltage and a second current at a second voltage;
   identifying a fictional relationship between the first and second currents wherein the predetermined relationship comprises a running average of the functional relationship for the devices previously tested; and
   comparing the functional relationship to a predetermined relationship to determine whether the device is defective, wherein the predetermined relationship is determined by at least one of evaluating the functional relationship for at least one other die on the same wafer or is determined from a plurality of dies fabricated previously.

* * * * *